US008081095B2

(12) United States Patent
Osawa et al.

(10) Patent No.: US 8,081,095 B2
(45) Date of Patent: Dec. 20, 2011

(54) DATA OUTPUT CIRCUIT

(75) Inventors: Yasuo Osawa, Gunma-ken (JP); Hiroyuki Arai, Gunma-ken (JP); Tetsuya Tokunaga, Gunma-ken (JP); Yoshiyuki Yamagata, Gunma-ken (JP)

(73) Assignees: Semiconductor Components Industries, LLC, Phoenix, AZ (US); Sanyo Semiconductor Co., Ltd., Gunma (JP)

( * ) Notice: Subject to any disclaimer, the term of this patent is extended or adjusted under 35 U.S.C. 154(b) by 866 days.

(21) Appl. No.: 12/134,525

(22) Filed: Jun. 6, 2008

(65) Prior Publication Data

US 2008/0303761 A1 Dec. 11, 2008

(30) Foreign Application Priority Data

Jun. 7, 2007 (JP) ................................ 2007-152048

(51) Int. Cl.
*H03M 9/00* (2006.01)

(52) U.S. Cl. ........................................................ 341/101

(58) Field of Classification Search .................. 341/100, 341/101
See application file for complete search history.

(56) References Cited

U.S. PATENT DOCUMENTS

| | | | | |
|---|---|---|---|---|
| 5,982,309 | A * | 11/1999 | Xi et al. | 341/101 |
| 6,169,501 | B1 * | 1/2001 | Ryan | 341/101 |
| 6,188,339 | B1 * | 2/2001 | Hasegawa | 341/101 |
| 7,619,547 | B2 * | 11/2009 | Yamagata et al. | 341/100 |
| 2010/0149137 | A1 * | 6/2010 | Saito | 345/204 |

FOREIGN PATENT DOCUMENTS

JP 2004-146806 5/2004

* cited by examiner

*Primary Examiner* — Howard Williams
(74) *Attorney, Agent, or Firm* — SoCal IP Law Group LLP; Steven C. Sereboff; John E. Gunther

(57) ABSTRACT

A data output circuit includes: a data generating circuit configured to generate output data; and a serial output circuit configured to receive an address corresponding to the data generating circuit, hold a parallel data input during a time period over which the address is being received, and serially output the output data generated by the data generating circuit and the held parallel data in accordance with an output direction signal for directing output of the data.

4 Claims, 4 Drawing Sheets

DATA OUTPUT CIRCUIT

CROSS-REFERENCE TO RELATED APPLICATION

This application claims the benefit of priority to Japanese patent application No. 2007-152048, filed Jun. 7, 2007, of which full contents are incorporated herein by reference.

BACKGROUND OF THE INVENTION

1. Field of the Invention

The present invention relates to a data output circuit.

2. Description of the Related Art

An electronic device such as a car stereo having a liquid crystal display panel is equipped with a data processing system for processing data or signals from an operation unit such as a key pad, an infrared remote control, and a rotary encoder switch. Since the data processing at the data processing system is mainly carried out by a microcomputer, it is necessary to input the data from the operating unit into the microcomputer.

FIG. 5 shows an example of a block diagram of a data processing system at a liquid crystal display unit of a car stereo. Infrared data from the infrared remote control, a rotary encoder switch signal A and a rotary encoder switch signal B from a rotary encoder switch (hereinafter, a rotary encoder switch signal will be referred to as a switch signal) are each input directly into a microcomputer 600. On the other hand, a key input resulting from the operation of a key pad 601 is input into the microcomputer 600 via a key data output circuit 610 in a liquid crystal display driver IC (Integrated Circuit) 602 (see, for example, Japanese patent application Laid-Open Publication No. 2004-146806). The microcomputer 600, based on a signal input thereinto, outputs a DI signal into the liquid crystal display driver IC 602. Then, the liquid crystal display driver IC 602 receives the DI signal to output an electrode drive signal for driving an electrode of the liquid crystal display panel. Here, with reference to the timing chart shown in FIG. 6, the key data corresponding to the key input from the key pad 601 will be further described. The key data obtained by operating the key pad 601 is stored in the key data output circuit 610 in the liquid crystal display driver IC 602. When the DI signal as the address of the liquid crystal display driver IC 602 and a high level (H level) CE signal indicating the output of the key data stored in the key data output circuit 610 are input from the microcomputer 600 into the liquid crystal display driver IC 602, the key data is output into the microcomputer 600 as output data DO on the basis of a clock signal CL, as shown in the timing chart of FIG. 6.

In the case of the liquid crystal display unit of a car stereo as mentioned above, it is necessary to input into the liquid crystal display driver IC 602 infrared data or switch signals that were input directly into the microcomputer 600, and to serially output the infrared data or switch signals by using an output signal line 700 that the key data is output into, for the purpose of reducing the number of signal lines leading into the microcomputer.

Moreover, due to the issues of the data processing on the microcomputer side, even if infrared data or switch signals are input into the liquid crystal display driver IC 602, it is required that the timing for starting the output of data coincides with the timing for starting the output of the key data shown in FIG. 6. In the case where the liquid crystal display driver IC 602 serially outputs newly added infrared data or switch signals, however, there is needed a time period for parallel-to-serial converting, which disadvantageously results in the problem that the output of data cannot be started at the same timing as that for the output of the key data to be started shown in FIG. 6.

SUMMARY OF THE INVENTION

A data output circuit according to an aspect of the present invention includes: a data generating circuit configured to generate output data; and a serial output circuit configured to receive an address corresponding to the data generating circuit, hold a parallel data input during a time period over which the address is being received, and serially output the output data generated by the data generating circuit and the held parallel data in accordance with an output direction signal for directing the output of the data.

Other features of the present invention will become apparent from descriptions of this specification and of the accompanying drawings.

BRIEF DESCRIPTION OF THE DRAWINGS

For more thorough understanding of the present invention and advantages thereof, the following description should be read in conjunction with the accompanying drawings, in which.

DETAILED DESCRIPTION OF THE INVENTION

At least the following details will become apparent from descriptions of this specification and of the accompanying drawings.

Figure 1:
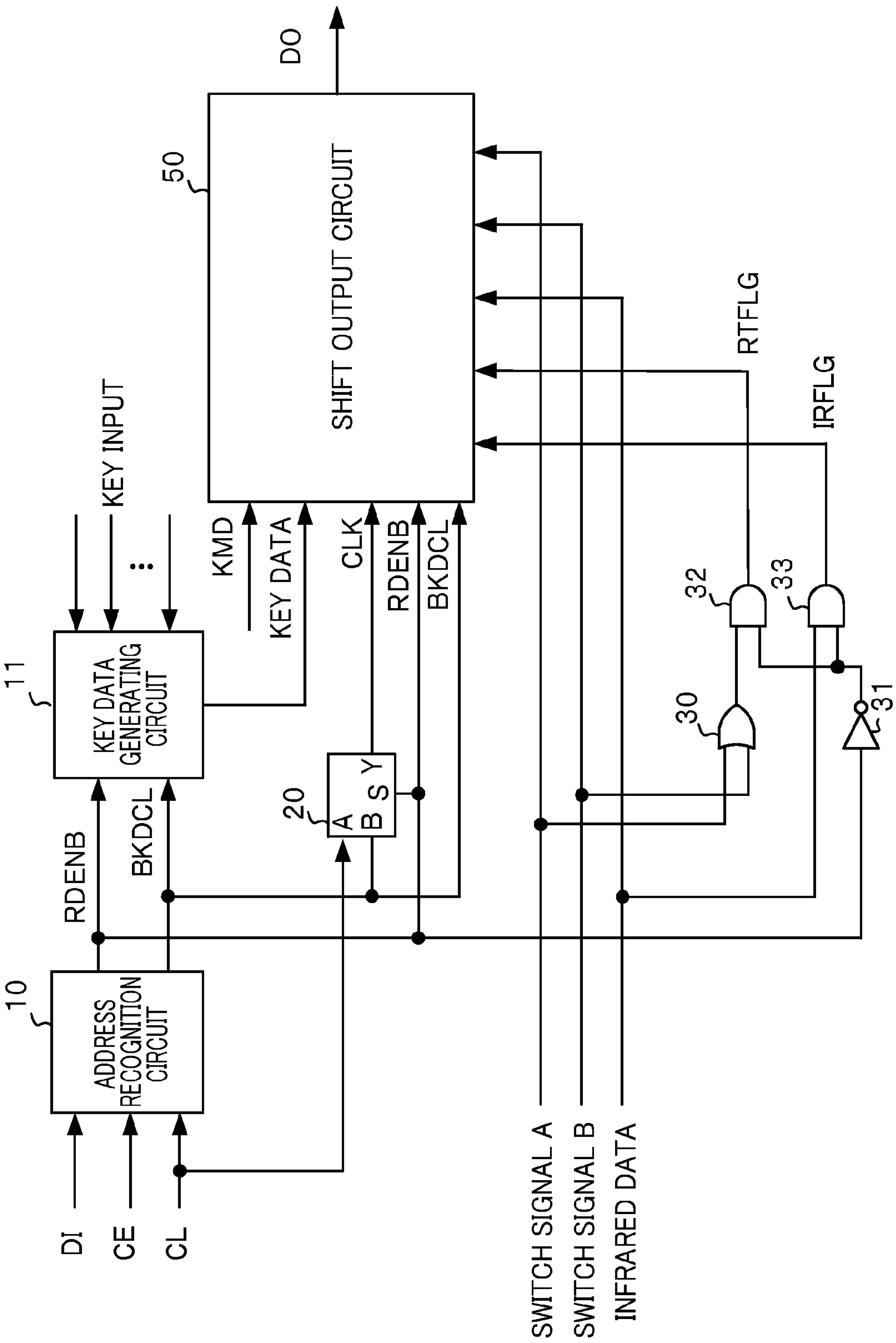
FIG. 1 is a view showing a data output circuit according to an embodiment of the present invention.
Figure 2:
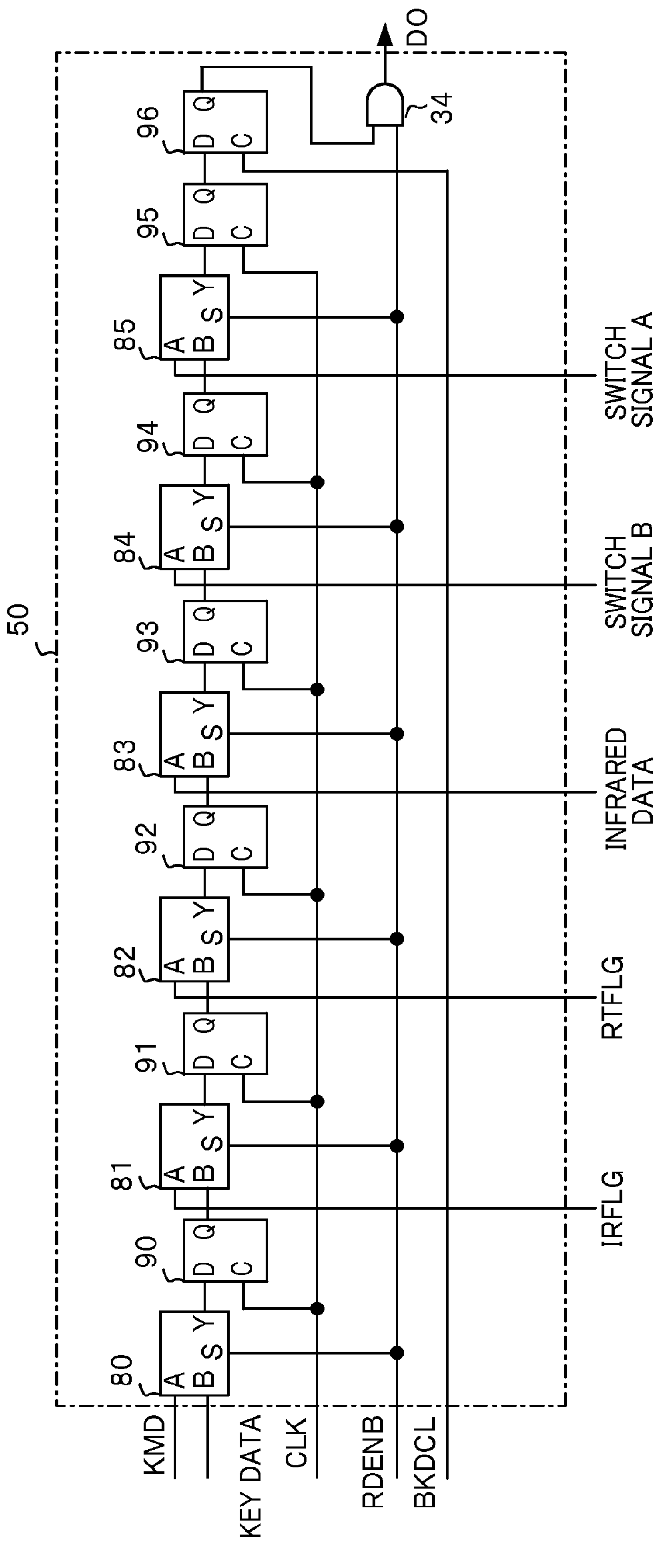
FIG. 2 is a circuit diagram showing an example of a shift output circuit 50.

FIG. 1 is a view showing the data output circuit according to an embodiment of the present invention. FIG. 2 is a circuit diagram of an example of the shift output circuit 50 shown in FIG. 1. Hereinafter, the data output circuit according to the present embodiment will be described with reference to FIGS. 1 and 2. It should be noted that the data output circuit shown in FIG. 1 is mounted in a liquid crystal display driver IC (not shown) for driving a liquid crystal display panel of a car stereo.

The data output circuit shown in FIG. 1 receives an input signal DI, an output direction signal CE, and a clock signal CL (clock signal) from a microcomputer, and then outputs a switch signal A and a switch signal B from a rotary switch, infrared data from an infrared remote control, key data resulted from the operation of a key pad, and a KMD signal indicating the presence or absence of the key data as output data DO to the microcomputer. The data output circuit shown in FIG. 1 includes an address recognition circuit 10, a key data generating circuit 11, a multiplexer 20, an OR circuit 30, an inverter 31, AND circuits 32, 33, and a shift output circuit 50. It should be noted that the address recognition circuit 10, the multiplexer 20, the OR circuit 30, the inverter circuit 31, the AND circuits 32, 33, the shift output circuit 50 correspond to a serial output circuit according to the present invention.

The address recognition circuit 10 recognizes whether or not an address is an address allocated to the IC including the data output circuit, that is, the liquid crystal display driver IC according to the present embodiment; and outputs an output start signal RDENB based on CE and a clock signal BKDCL based on CL, when recognizing that the address is the address allocated to the liquid crystal display driver IC. It should be noted that according to the present embodiment, RDENB is output at the same logic level as that of CE, and that BKDCL is a clock signal that is at L level when CE is at L level and changes at the same timing as CL does when CE is at H level.

The key data generating circuit 11 serially outputs the key input that is input from the key pad to the shift output circuit 50 as key data, on the basis of RDENB and BKDCL from the address recognition circuit 10.

It should be noted that: the address recognition circuit 10 corresponds an address circuit according to the present invention; the key data generating circuit 11 corresponds to a data generating circuit according to the present invention; the output direction signal CE at H level corresponds to an output direction signal according to the present invention; and RDENB corresponds to an output start signal according to the present invention. Further, it should be noted that the address allocated to the liquid crystal display driver IC corresponds to an address allocated to the data generating circuit according to the present invention.

The multiplexer 20 selects either CL to be input to an A input or BKDCL to be input to a B input in accordance with the level of RDENB to be input to an S input, and then outputs the selected result as a clock signal CLK into the shift output circuit 50. It should be noted that when RDENB to be input to the S input of the multiplexer 20 is at L level, a signal on the A input is output to a Y output, and when the RDENB is at H level, a signal on the B input is output to the Y output. Further, note that multiplexers 80 through 85 operate in the same way as the multiplexer 20 does.

The OR circuit 30, the inverter 31, and the AND circuit 32 output a flag signal RTFLG indicating that the rotary encoder switch is changed. Here, a signal of a logical OR of the switch signal A and the switch signal B, and the output of the inverter 31 are input into the AND circuit 32.

The inverter 31 and the AND circuit 33 output a flag signal IRFLG indicating the presence or absence of the infrared data. Here, the infrared data and the output of the inverter 31 are input into the AND circuit 32.

Figure 3:
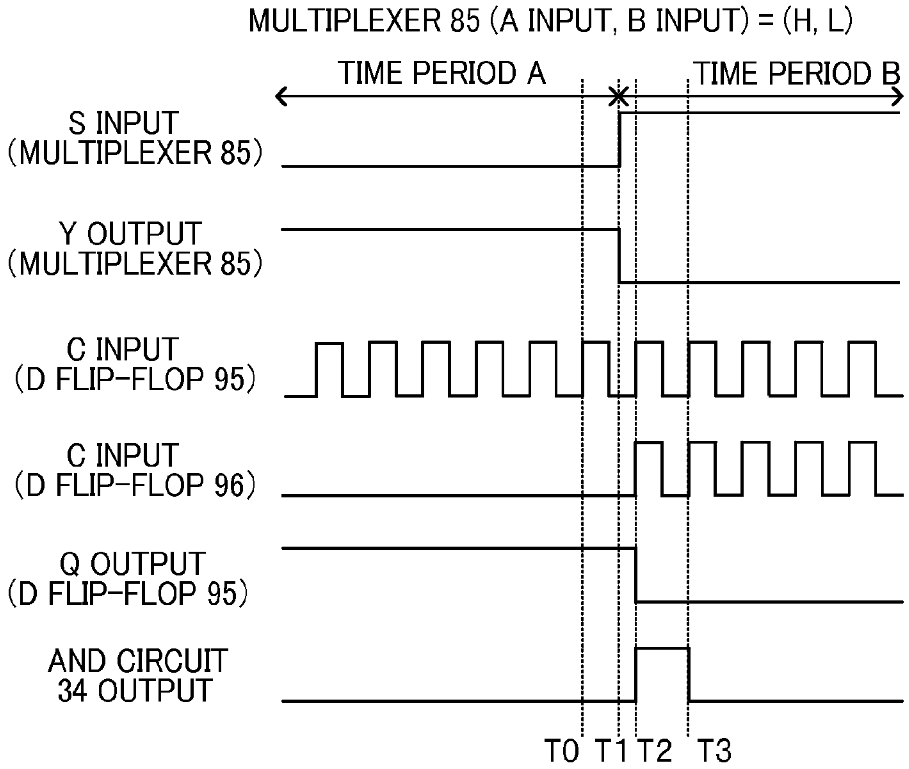
FIG. 3 is a timing chart for illustrating an example of the operation of a circuit including a multiplexer 85 and D flip-flops 95, 96 in the shift output circuit 50.

The shift output circuit 50 holds the switch signal A, the switch signal B, the infrared data, RTFLG, IRFLG, and KMD, all being input in parallel, on the basis of CLK from the multiplexer 20; and serially outputs, when RDENB at H level is input thereinto, the above-mentioned held data and the key data from the key data generating circuit 11 as output data DO on the basis of CLK. Further, the shift output circuit 50 includes the multiplexers 80 through 85, the D flip-flops 90 through 96, and the AND circuit 34. With reference to the timing chart of FIG. 3, the operation of the circuit made up of the multiplexer 85, the D flip-flops 95, 96, and the AND circuit 34, which are a part of the shift output circuit 50, will be explained in order to describe how the shift output circuit 50 holds and serially outputs the above-mentioned data. It should be noted that a signal at H level, a signal at L level, and a signal changing in level from L to H at the time T1 are respectively input to the A input, the B input, and the S input of the multiplexer 85. Further, it should be noted that a clock signal with a predetermined period is input to the C input of the D flip-flop 95 and the predetermined clock signal input into the D flip-flop 95 is input to the C input of the D flip-flop 96, when the signal to be input to the S input of the multiplexer 85 becomes H level. There are input into the AND circuit 34: the signal changing in level from L to H at the time T1 to be input to the S input of the multiplexer 85; and a signal from a Q output of the D flip-flop 96.

During a time period A over which the signal input to the S input of the multiplexer 85 is at L level, the signal at H level input to the A input of the multiplexer 85 is output from the Y output of the multiplexer 85. Since the output from the Y output of the multiplexer 85 is to be input to the D input of the D flip-flop 95, a signal at H level is output from the Q output of the D flip-flop 95 on the basis of a clock signal input to the C input of the D flip-flop 95. The signal from the Q output of the D flip-flop 95 during the time period A is determined in accordance with the last pulse during the time period A, which last pulse is input at the time T0. Note that the output from the AND circuit 34 during the time period A is at L level because a signal at L level is input into the AND circuit 34.

During a time period B over which the signal input to the S input of the multiplexer 85 is at H level, the signal at L level input to the B input of the multiplexer 85 is output from the Y output of the multiplexer 85. The signal on the D input of the D flip-flop 95 therefore becomes L level and the signal at L level is held by the D flip-flop 95 on the basis of a pulse at the time T2, which pulse is input to the C input of the D flip-flop 95 during the time period B. First, the D flip-flop 96 outputs the signal at H level held by the D flip-flop 95 during the time period A from the Q output on the basis of the pulse at the time T2. After that, when a pulse at the time T3 is input to the C input of the D flip-flop 96, the signal at L level held by the D flip-flop 95 on the basis of the pulse at the time T2 is output from the Q output of the D flip-flop 96. Since a signal at H level and the output from the D flip-flop 96 are input into the AND circuit 34 during the time period B, the AND circuit 34 outputs a signal that is the same in logic level as the output of the D flip-flop 96.

The multiplexers 80 through 84 at the shift output circuit 50 operate in the same manner as the above-mentioned multiplexer 85 does, while the D flip-flops 90 through 94 operate in the same manner as the above-mentioned D flip-flop 95 does. As a result, during a time period over which signals input to the respective S inputs of the multiplexers 80 through 85 are at L level, the D flip-flops 90 through 95 hold signals input to the respective A inputs of the multiplexers 80 through 85 on the basis of a pulse at H level input to the respective C inputs of the D flip-flops 90 through 95. Furthermore, the signals held in accordance with a pulse at H level input to the respective C inputs of the D flip-flops 90 through 95 at the end of the time period over which the signals input to the respective S inputs of the multiplexers 80 through 85 are at L level, are sequentially output from the Q output of the D flip-flop 96 on the basis of a clock signal input to the C input of each of the D flip-flops 90 through 96 during the time period over which the signals input to the respective S inputs of the multiplexers 80 through 85 are at H level. Accordingly, the D flip-flops 90 through 96 operate as a shift register when the signals input into the multiplexers 80 through 85 are at H level.

Figure 4:
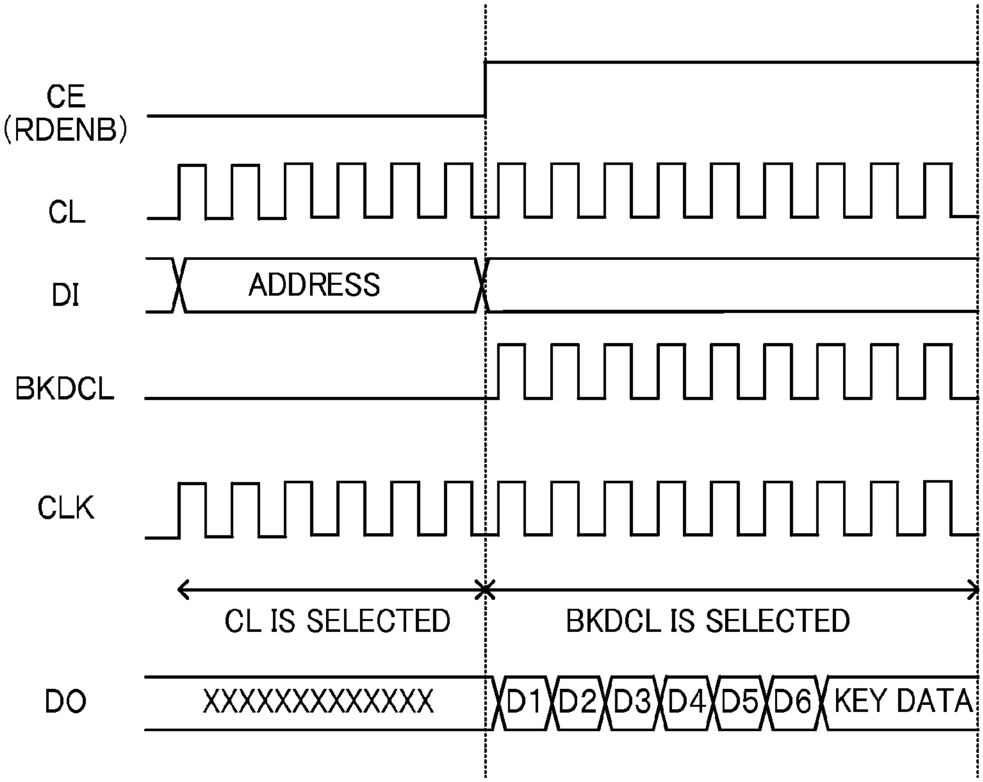
FIG. 4 is a timing chart for illustrating the operation of a data output circuit according to an embodiment of the present invention.
Figure 5:
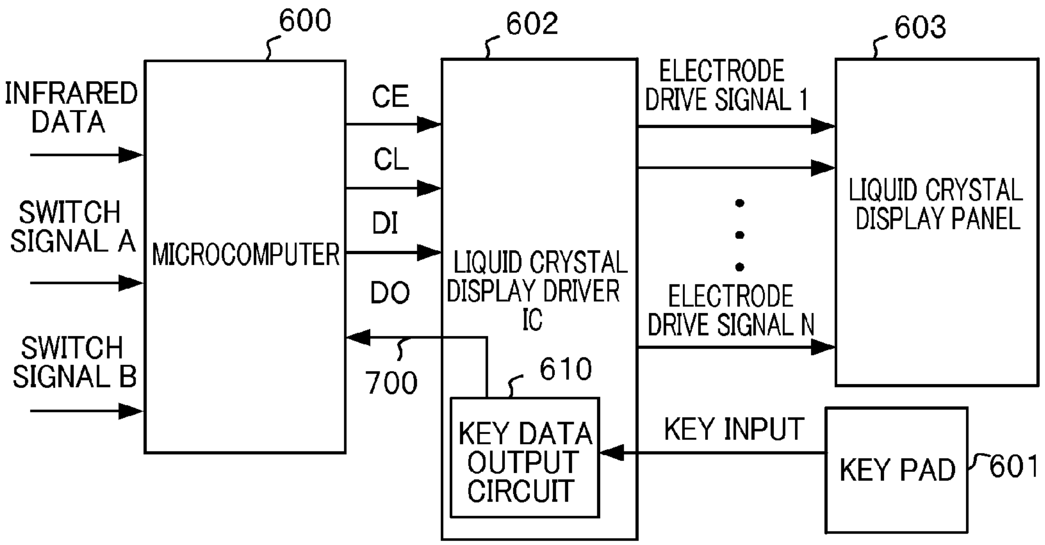
FIG. 5 is a block diagram showing a data processing system of a car stereo.

Hereinafter, the operation of the data output circuit shown in FIG. 1 will be described with reference to the timing chart shown in FIG. 4. Note that according to the present embodiment, the period of CL is set sufficiently shorter than the respective periods of a switch signal A, a switch signal B, and infrared data, so that the switch signal A, the switch signal B, and the infrared data are each at a constant logic level during the period shown in the timing chart of FIG. 4. Further, according to the present embodiment, the switch signal A, the switch signal B, and the infrared data are respectively set at H level, L level, and L level. Furthermore, according to the present embodiment, the key data is present and KMD should be at H level. Note that in the present description, the above state will be expressed as follows: (switch signal A, switch signal B, infrared data, KMD)=(H, L, L, H). Firstly, the operation of the data output circuit during a time period over which the output direction signal CE is at L level will be described. It should be noted that according to the present embodiment, when data other than the address corresponding to the liquid crystal driver IC is input into the address recognition circuit 10 having the address corresponding to the liquid crystal display driver IC, the data output circuit does not output data. Therefore, only the case where the address corresponding to the liquid crystal display driver IC is input will be described in the following. As DI is input on the basis of CL, the address of the liquid crystal display driver IC is received. RDENB and BKDCL, which are each the output from the address recognition circuit 10, both become L level, since CE is at L level.

Since RDENB at L level is to be input to the S input of the multiplexer 20, CL is selected as CLK output from the Y output. A flag signal RTFLG indicating that the rotary encoder switch changes becomes H level because of (switch signal A, switch signal B)=(H, L), while a flag signal IRFLG indicating the presence or absence of the infrared data becomes L level because the infrared data is at L level. To sum up the signals or data input into the shift output circuit 50, it reads (RDENB, switch signal A, switch signal B, infrared data, RTFLG, IRFLG, KMD)=(L, H, L, L, H, L, H). It should be noted that CL is selected for CLK and BKDCL is at L level. Since RDENB is input to the respective S inputs of the multiplexers 80 through 85 of the shift output circuit 50, (switch signal A, switch signal B, infrared data, RTFLG, IRFLG, KMD)=(H, L, L, H, L, H) is held by the D flip-flops 90 through 95 as described above. It should be noted that during this time period, BKDCL input to the C input of the D flip-flop 96 is at L level and RDENB input into the AND circuit 34 is also at L level, so that the shift output circuit 50 does not output the data held by CLK.

Secondly, the operation of the data output circuit during the time period over which the output direction signal CE is at H level will be described below. When CE input into the address recognition circuit 10 becomes H level, the address recognition circuit 10 outputs RDENB at H level and BKDCL based on CL. The key data generating circuit 11 serially outputs key data to the shift output circuit 50 on the basis of BKDCL. The key data output from the key data generating circuit 11 is input to the B input of the multiplexer 80 of the shift output circuit 50, and the shift output circuit 50 sequentially outputs the held (switch signal A, switch signal B, infrared data, RTFLG, IRFLG, KMD)=(H, L, L, H, L, H) and the key data on the basis of BKDCL. Note that D1 through D6 shown in FIG. 4 respectively correspond to the logic levels of the switch signal A, the switch signal B, the infrared data, RTFLG, IRFLG, and KMD.

Figure 6:
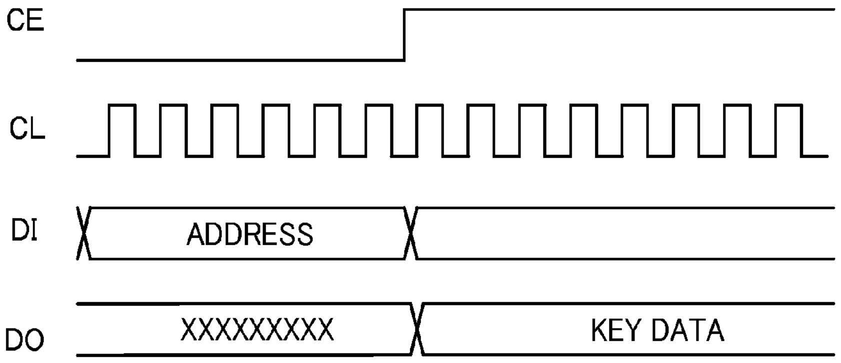
FIG. 6 is a timing chart for illustrating the operation of the data processing system shown in FIG. 5.

The data output circuit according to the present embodiment described above holds data (switch signal A, switch signal B, infrared data, RTFLG, IRFLG, KMD) input during a time period over which the address at the time of CE at L level is input, and serially outputs the held data and the key data when the CE at H level is input thereinto. It therefore becomes possible to start outputting the held data and the key data at the same start timing as that of the key data shown in FIG. 6 while reducing the number of the signal lines of the data input into the microcomputer. Moreover, the data output circuit according to the present embodiment described above makes it possible to increase the number of serial data without changing the output start timing of the serial data output to the microcomputer.

Further, since a clock signal CL for receiving the address is used when the data input into the data output circuit are held by the D flip-flops 90 through 95, there is no need to provide an extra circuit for generating a clock signal.

Furthermore, the data output circuit according to the present embodiment includes the address recognition circuit 10 for receiving the address during the time period over which CE is at L level, and the key data generating circuit 11 for serially outputting the key data on the basis of BKDCL by RDENB based on CE, and the shift output circuit 50 for holding the data (switch signal A, switch signal B, infrared data, RTFLG, IRFLG, KMD) input on the basis of CL for receiving the address of the liquid crystal display driver IC during the time period over which CE is at H level and sequentially serial-outputting the held data and the key data on the basis of the BKDCL.

In the data output circuit according to the present embodiment, the held data such as infrared data is output bit by bit when CE becomes H level. In order to output the infrared data five bits, therefore, the data output circuit must repeat such operation five times that it holds infrared data during the time period over which CE is at L level, and outputs the held infrared data on the basis of BKDCL during the time period over which CE is at H level. In this case, it is unknown whether the key data is always present or not at the time in which the infrared data is output. The data output circuit according to the present embodiment is therefore so configured as to output KMD indicating the presence or absence of the key data before outputting the key data. As a result, the microcomputer can determine whether the key data is present or not by receiving KMD, and the data processing time can be shortened when no key data is present.

The above embodiments of the present invention are simply for facilitating the understanding of the present invention and are not in any way to be construed as limiting the present invention. The present invention may variously be changed or altered without departing from its spirit and encompass equivalents thereof.

What is claimed is:

1. A data output circuit comprising:

a data generating circuit configured to generate output data; and a serial output circuit configured to receive an address corresponding to the data generating circuit, hold a parallel data input during a time period over which the address is being received, and serially output the output data generated by the data generating circuit and the held parallel data in accordance with an output direction signal for directing output of the data.

2. The data output circuit according to claim 1, wherein the serial output circuit is further configured to: receive the address corresponding to the data generating circuit on the basis of a clock signal; and hold the parallel data input into the serial output circuit on the basis of the clock signal.

3. The data output circuit according to claim 2, wherein the serial output circuit includes:

an address circuit configured to receive the address corresponding to the data generating circuit, and output an output start signal into the data generating circuit in order to cause the data generating circuit to serially output the output data, when the output direction signal is input; and a shift output circuit configured to hold the parallel data as memory data on the basis of the clock signal during a time period over which the address corresponding to the data generating circuit is being input, add to the memory data the output data serially output from the data generating circuit and shift and serially output the memory data added with the output data on the basis of the clock signal, when the output direction signal is input.

4. The data output circuit according to claim 3, wherein the shift output circuit is further configured to hold an output determining data indicating presence or absence of the output data as a part of the memory data, add the output data from the data generating circuit to the memory data in such a manner that the output data is output after the parallel data and the output determining data, and shift and serially output the memory data added with the output data on the basis of the clock signal when the output direction signal is input.

* * * * *